United States Patent [19]

Matsumoto

[11] Patent Number: 4,629,323
[45] Date of Patent: Dec. 16, 1986

[54] BIREFRINGENCE TYPE MEASURING DEVICE

[75] Inventor: Mitsuo Matsumoto, Kokubunji, Japan

[73] Assignee: Tokyo Shibaura Denki Kabushiki Kaisha, Kawasaki, Japan

[21] Appl. No.: 514,658

[22] Filed: Jul. 18, 1983

[30] Foreign Application Priority Data

Jul. 23, 1982 [JP] Japan ............................. 57-127658

[51] Int. Cl.$^4$ ................................................ G01N 21/21
[52] U.S. Cl. .................................... 356/365; 250/227; 324/96; 356/368
[58] Field of Search ............... 356/33, 33.5, 349, 351, 356/365, 368; 250/225, 227; 324/96; 307/516, 514; 328/134

[56] References Cited

U.S. PATENT DOCUMENTS 3,164,777 1/1965 Guanella ........................... 328/134
4,442,350 4/1985 Rashleigh ....................... 356/33 X

FOREIGN PATENT DOCUMENTS 1766079 5/1971 Fed. Rep. of Germany.
2130046 1/1973 Fed. Rep. of Germany.
2068137 8/1981 United Kingdom ............ 324/96
742805 6/1980 U.S.S.R. ............................ 324/96

OTHER PUBLICATIONS

Bucaro et al., "Measurement of Sensitivity of Optical Fiber for Acoustic Detection," *Applied Optics*, vol. 18, No. 6, (Mar. 15, 1979), pp. 938-940.
Trinks et al., "Electro-Optical System for EMP Measurement," *IEEE Transactions on Electromagnetic Compatibility*, vol. EMC-22, No. 1 (Feb. 1980), pp. 75-77.

*Primary Examiner*—Davis L. Willis
*Assistant Examiner*—Matthew W. Koren
*Attorney, Agent, or Firm*—Schwartz, Jeffery, Schwaab, Mack, Blumenthal & Evans

[57] ABSTRACT

In a measuring device utilizing birefringence effect, there are provided a device for producing laser light having two components polarized in directions perpendicular to each other and respectively having first and second frequencies; and a birefringence device which receives the laser light and delivers an optical output having a phase difference between the two components which is varied in accordance with the measured quantity. A specific component of the optical output is extracted by an optical analyzer, and converted into an electric signal which is processed thereafter into an output signal representing the phase difference and hence the measured quantity.

7 Claims, 5 Drawing Figures

BIREFRINGENCE TYPE MEASURING DEVICE

BACKGROUND OF THE INVENTION

This invention relates to a birefringence type measuring device which is used for measuring physical values such as voltage, electric field or the like by utilizing a birefringence effect such as Pockels effect, and more particularly to a type thereof wherein a birefringence phase difference is detected for measuring voltages and the like.

A device for measuring voltage or the like utilizing Pockels effect has been widely known. In this device, a linearly polarized light entering into a birefringence substance is split into two beams, the polarization directions thereof being perpendicular with each other. In the substance, the beams transmit along different paths that exhibit different refractive indices, thereby causing a phase difference between the two beams. When an electric field corresponding to a voltage to be measured is applied across the birefringence substance, the refractive indices along the light paths change, thus varying the phase difference between the two beams.

The device utilizing the Pockels effect is advantageous in it is easy to insulate that it does not disturb the electric field to be measured, and it exhibits better frequency characteristics than those devices utilizing potential transformers and the like. However, since the known devices detect the variation of the phase difference by measuring the amplitude or the intensity of the light output, the measurement is liable to be disturbed by the loss in light intensity along the paths and the detected variation of the phase difference tends to be not proportional to the voltage or electric field to be measured. Furthermore, since the light intensity is converted into an electric signal by a photoelectric converter such as a photodiode, the amplitude of the signal tends to be varied by the drift of the characteristics of the converter due to temperature variation or the like.

The construction of a conventional voltage measuring device utilizing the Pockels effect, and the difficulties of the device will be described in more detail with reference to FIG. 1.

A laser light source 1 emits a linearly polarized laser light $E_1$ of a single frequency $\omega$ with a plane (or direction) of polarization directed at an angle of 45° relative to the x axis. The laser light transmits in the direction of the z axis through a substance 2 exhibiting the Pockels effect, a quarter wave length ($\lambda/4$) plate 4, and an optical analyzer 5 to a photodiode 6. Assuming an orthogonal coordinate system inclusive of the x and z axes, when a voltage V to be measured is applied from a source 3 to the substance 2 as shown in FIG. 1, a component $e_z$ of an electric field expressed as $e_z=V/L$ is created in the direction of the z axis as shown in FIG. 1, wherein L represents the length of the substance 2 measured along the z axis. Under the electric field $e_z$, the substance 2 exhibits a birefringence phenomenon in the principal axes x and y, changing the refractive index $n_x$ for the x-component $E_x$ of the linearly polarized light $E_1$ to $n+\Delta n/2$, and the refractive index $n_y$ for the y-component $E_y$ of the linearly polarized light $E_1$ to $n-\Delta n/2$, wherein n represents the refractive index of the substance 2 at the time when the z-component $e_z$ of the electric field is zero and hence $n_x$ is equal to $n_y$, and $\Delta n$ represents an increment of the refractive index n. The increment $\Delta n$ is proportional to the z-axis component $e_z$ of the voltage V applied to the substance 2 manifesting the Pockels effect, that is $\Delta n = k e_z$ wherein k is a constant.

As a consequence, when the linearly polarized light $E_1$ having components $E_x$ and $E_y$ (hereinafter termed optical wave components) passes through the substance 2 of the length L, a phase difference $\gamma$ of the following magnitude appears between the two optical wave components $E_x$ and $E_y$.

$$\begin{aligned}
\gamma &= \frac{2\pi}{\lambda}(n_x - n_y)L \\
&= \frac{2\pi}{\lambda}\Delta n L \\
&= \frac{2\pi}{\lambda} k e_z L \\
&= \frac{2\pi k}{\lambda} V
\end{aligned} \tag{1}$$

wherein $\lambda$ represents the wavelength in vacuum of the laser light.

Thus, by measuring the phase difference $\gamma$ between the two components $E_x$ and $E_y$, the magnitude of the component $e_z$ or the voltage V can be determined from the equation (1).

Assuming that a represents the amplitude of the linearly polarized laser light $E_1$ polarized in a plane at an angle of 45° with respect to the x and y axes, the laser light having an angular frequency $\omega$ can be expressed as $$E_1 = a e^{j\omega t}$$

and the components $E_x$ and $E_y$ of the x and y axes are $$\left. \begin{aligned} E_x &= \frac{a}{\sqrt{2}} e^{j\omega t} \\ E_y &= \frac{a}{\sqrt{2}} e^{j\omega t} \end{aligned} \right\} \tag{2}$$

When the laser light $E_1$ having the two components passes through the Pockels cell 2 with an electric field $e_z$ applied thereto, a phase difference $\gamma$ as follows is provided between the components $E_x'$, $E_y'$ and components $E_x$, $E_y$, where components $E_x'$, $E_y'$ are the x and y axes components delivered from the cell 2.

$$\begin{bmatrix} E_x' \\ E_y' \end{bmatrix} = \begin{bmatrix} e^{j\frac{\gamma}{2}} & 0 \\ 0 & e^{-j\frac{\gamma}{2}} \end{bmatrix} \begin{bmatrix} E_x \\ E_y \end{bmatrix} \tag{3}$$

$$= \begin{bmatrix} \frac{a}{\sqrt{2}} e^{j(\omega t + \frac{\gamma}{2})} \\ \frac{a}{\sqrt{2}} e^{j(\omega t - \frac{\gamma}{2})} \end{bmatrix}$$

That is, the output of the Pockels cell 2 is polarized elliptically.

The output laser light of the cell 2 is then passed through the quarter wave length plate 4 principal axes of which extend in alignment with x and y axes so that the optical wave components thereof are changed to $E_x''$ and $E_y''$ which are expressed as follows.

$$\begin{bmatrix} E_x'' \\ E_y'' \end{bmatrix} = \begin{bmatrix} e^{j\frac{\pi}{4}} & 0 \\ 0 & e^{-j\frac{\pi}{4}} \end{bmatrix} \begin{bmatrix} E_x' \\ E_y' \end{bmatrix} \quad (4)$$

$$= \begin{bmatrix} \frac{a}{\sqrt{2}} e^{j(\omega t + \frac{\gamma}{2} + \frac{\pi}{4})} \\ \frac{a}{\sqrt{2}} e^{j(\omega t - \frac{\gamma}{2} - \frac{\pi}{4})} \end{bmatrix}$$

Therefore, the output of the quarter wave length plate 4 is also an elliptically polarized wave.

The optical analyzer 5 passes only one component $E_{45}$ of the output of the quarter wavelength plate 4, which is polarized in a plane forming an angle of 45° with respect to either of the x axis and y axis.

$$E_{45} = \frac{1}{\sqrt{2}} E_x'' + \frac{1}{\sqrt{2}} E_y'' \quad (5)$$

$$= \frac{a}{2} \left[ e^{j(\frac{\gamma}{2} + \frac{\pi}{4})} + e^{-j(\frac{\gamma}{2} + \frac{\pi}{4})} \right] e^{j\omega t}$$

$$= a \cos\left(\frac{\gamma}{2} + \frac{\pi}{4}\right) e^{j\omega t}$$

The component $E_{45}$ is then applied to the photodiode 6 which converts the component $E_{45}$ into a current signal I proportional to the intensity $|E_{45}|^2$ thereof. That is, the current signal I is expressed by $$I = |E_{45}|^2 = a^2 \cos^2\left(\frac{\gamma}{2} + \frac{\pi}{4}\right) \quad (6)$$

$$= \frac{a^2}{2}(1 - \sin\gamma)$$

From the equation (6), it is apparent that the output electric signal from the device shown in FIG. 1 is not proportional to $\gamma$ but is proportional to $\sin \gamma$, and hence an additional device for calculating $$\gamma = \sin^{-1}\left(1 - \frac{2I}{a^2}\right)$$

is required. Furthermore, each time $\gamma$ varies by 360°, the output electric signal I resumes the original value, thus restricting the measuring range to ±180°.

Still another and more serious difficulty of the device shown in FIG. 1 is that a drift of characteristic inevitably occurs during the conversion step of the light intensity $|E_{45}|^2$ into the electric signal I carried out by the photodiode 6. More specifically, a dark current tending to be varied by temperature flows through the photodiode 6 in addition to the current signal I of equation (6), thus causing a serious error in the measurement. Furthermore, even in a case where the phase difference $\gamma$ is constant, the electric signal I is varied by the variation of the amplitude a of the laser light from the source 1, and also by light losses in light paths.

SUMMARY OF THE INVENTION

An object of the present invention is to provide a birefringence type measuring device wherein the above described difficulties of the conventional device can be substantially eliminated.

A more specific object of the invention is to provide a birefringence type measuring device, the output of which is not disturbed by the transmission loss of the laser light or by the drift in the characteristic of the photoelectric converter.

Another object of the invention is to provide a birefringence type measuring device, the output of which is directly proportional to the quantity to be measured.

Still another object of the invention is to provide a birefringence type measuring device whose measuring range is substantially larger than that of the conventional device.

According to the present invention, there is provided a measuring device utilizing birefringence effect comprising: means for producing laser light having two components of a first frequency and a second frequency, which are polarized in directions perpendicular to each other; birefringence means provided to receive the laser light and to deliver an output laser light wherein the phase difference of the birefringence means is varied in accordance with a quantity to be measured; an optical analyzer provided to receive the optical output of the birefringence means and to extract a component of the optical output polarized in a predetermined direction; a photoelectric converter for converting the extracted component of the optical output into an electric signal having a frequency corresponding to a difference between the first and second frequencies and being phase-modulated by the phase difference varied in accordance with the quantity to be measured; and means for processing the phase-modulated electric signal delivered from the photoelectric converter so as to produce an output representing the phase difference corresponding to the measured quantity.

The invention will be described in detail with reference to the accompanying drawings.

DESCRIPTION OF THE PREFERRED EMBODIMENTS

Figure 1:
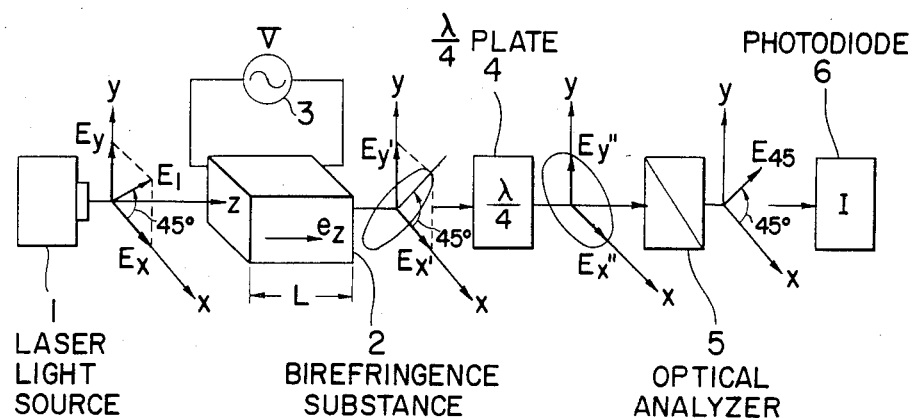
FIG. 1 is a diagrammatic representation showing the construction of a conventional birefringence type measuring device utilizing Pockels effect.

An optical system constituting a portion of the measuring device according to the present invention will first be described with reference to FIG. 2. A two-frequency laser light source 7 emits a linearly polarized laser light having an x-axis component $E_x$ of optical wave oscillating at a optical frequency of $\omega + \Delta\omega$, and a y-axis component $E_y$ of optical wave oscillating at another optical frequency $\omega$. A type of the two frequency laser light source utilizing the Zeeman effect is available on the market. Since the frequency difference $\Delta\omega$ is in the order of $2\pi \times 1.2 \times 10^6$ (rad/s), any of the known photodiodes can respond to the frequency difference $\Delta\omega$. Other than the above described laser light source utilizing Zeeman effect, an ordinary lateral mode laser device producing two frequency components of $\omega$ and $\omega + \Delta\omega$ which are linearly polarized in directions perpendicular to each other may be used for this purpose. Furthermore, a device comprising an optical frequency shifter such as a Bragg cell and capable of providing a frequency $\omega + \Delta\omega$ based on a frequency $\omega$ may be utilized as the laser light source 7.

The output of the laser light source 7 including the two frequency components polarized in directions perpendicular to each other transmits in the direction of z axis through a beam splitter 8 which splits the laser light into two parts. A portion of the laser light having optical wave components $E_x$ and $E_y$ as shown in FIG. 2 is then passed through a Pockels cell 11 exhibiting a birefringence effect and an optical analyzer 12 to a photodiode 13. The other portion of the laser light outputted from the beam splitter 8 is passed through another optical analyzer 9 to another photodiode 10.

When it is assumed that the amplitudes of the optical wave components $E_x$ and $E_y$ of the first portion of the laser light delivered from the beam splitter 8 are both $$\frac{a}{\sqrt{2}},$$

the components $E_x$ and $E_y$ are expressed as follows.

$$\left. \begin{array}{l} E_x = \frac{a}{\sqrt{2}} e^{j(\omega + \Delta\omega)t} \\ E_y = \frac{a}{\sqrt{2}} e^{j\omega t} \end{array} \right\} \quad (7)$$

When the components $E_x$ and $E_y$ of the equations (7) are passed through the Pockels cell 11 principal axes of which extend in alignment with x and y axes causing a birefringence phase difference $\gamma$, the x-axis component $E_x'$ and the y-axis component $E_y'$ of the output of the Pockels cell 11 are expressed as follows.

$$\begin{bmatrix} E_x' \\ E_y' \end{bmatrix} = \begin{bmatrix} e^{j\frac{\gamma}{2}} & 0 \\ 0 & e^{-j\frac{\gamma}{2}} \end{bmatrix} \begin{bmatrix} E_x \\ E_y \end{bmatrix} \quad (8)$$

$$= \begin{bmatrix} \frac{a}{\sqrt{2}} e^{j(\omega t + \Delta\omega t + \frac{\gamma}{2})} \\ \frac{a}{\sqrt{2}} e^{j(\omega t - \frac{\gamma}{2})} \end{bmatrix}$$

The optical analyzer 12 passes only a component $E_{45}$ of optical wave polarized in the direction forming an angle of 45° to the x axis, which is expressed as follows.

$$E_{45} = \frac{1}{\sqrt{2}} E_x' + \frac{1}{\sqrt{2}} E_y' = \frac{a}{2} \left[ e^{j(\Delta\omega t + \frac{\gamma}{2})} + e^{-j\frac{\gamma}{2}} \right] e^{j\omega t} \quad (9)$$

$$= \frac{a}{2} \left[ \cos\left(\Delta\omega t + \frac{\gamma}{2}\right) + j\sin\left(\Delta\omega t + \frac{\gamma}{2}\right) + \cos\left(-\frac{\gamma}{2}\right) + j\sin\left(-\frac{\gamma}{2}\right) \right] e^{j\omega t}$$

$$= |E_{45}| \, e^{j\delta} e^{j\omega t}$$

wherein $\tan\delta = \dfrac{\sin\Delta\omega t \cos\frac{\gamma}{2} + (\cos\Delta\omega t - 1)\sin\frac{\gamma}{2}}{(\cos\Delta\omega t + 1)\cos\frac{\gamma}{2} - \sin\Delta\omega t \sin\frac{\gamma}{2}}$ and $$|E_{45}| = \frac{a}{\sqrt{2}} \sqrt{1 + \cos(\Delta\omega t + \gamma)}$$

The photodiode 13 converts received component $E_{45}$ into an electric signal $I_x$ proportional to a light intensity $|E_{45}|^2$, which is expressed by an equation $$I_x = |E_{45}|^2 = \frac{a^2}{2}[1 + \cos(\Delta\omega t + \gamma)] \quad (10)$$

By passing the signal $I_x$ through an electric filter, not shown, a filter output electric signal having a frequency $\Delta\omega$ and phase-modulated by a birefringence phase difference $\gamma$ can be obtained. A method thus picking up the component of the frequency difference $\Delta\omega$ from the light having two frequencies $\omega$ and $\omega + \Delta\omega$ is hereinafter termed "optical superheterodyne demodulating method".

The other portion of the laser light delivered from the beam splitter 8 to the optical analyzer 9 is also a two-frequency laser light having two components similar to $E_x$ and $E_y$ of the equations (7). The optical analyzer 9 passes a component of the laser light polarized in a specific direction forming an angle of 45° to the x axis. That is, the output of the optical analyzer 9 is a component having an optical wave $E_{ref}$ of the following value.

$$E_{ref} = \frac{1}{\sqrt{2}}(E_x + E_y) = \frac{a}{2}(1 + e^{j\Delta\omega t})e^{j\omega t} \quad (11)$$

$$= |E_{ref}| \, e^{j\delta'} \cdot e^{j\omega t}$$

where $\tan\delta' = \dfrac{\sin\Delta\omega t}{1 + \cos\Delta\omega t}$ $$|E_{ref}| = \frac{a}{\sqrt{2}} \sqrt{1 + \cos\Delta\omega t}$$

The output of the optical analyzer 9 having the optical wave $E_{ref}$ is applied to the photodiode 10 and converted into an electric signal $I_{ref}$ proportional to the light intensity $|E_{ref}|^2$, thus $$I_{ref} = |E_{ref}|^2 = \frac{a^2}{2}(1 + \cos\Delta\omega t) \qquad (12)$$

Thus by extracting only the $\Delta\omega$ frequency component out of the electric signal $I_{ref}$, an electric signal of the frequency $\Delta\omega$ and having a reference phase angle can be obtained.

An electric circuit for processing the output electric signals from the photodiodes 10 and 13 in FIG. 2 will now be described with reference to FIGS. 3 and 4.

Figure 3:
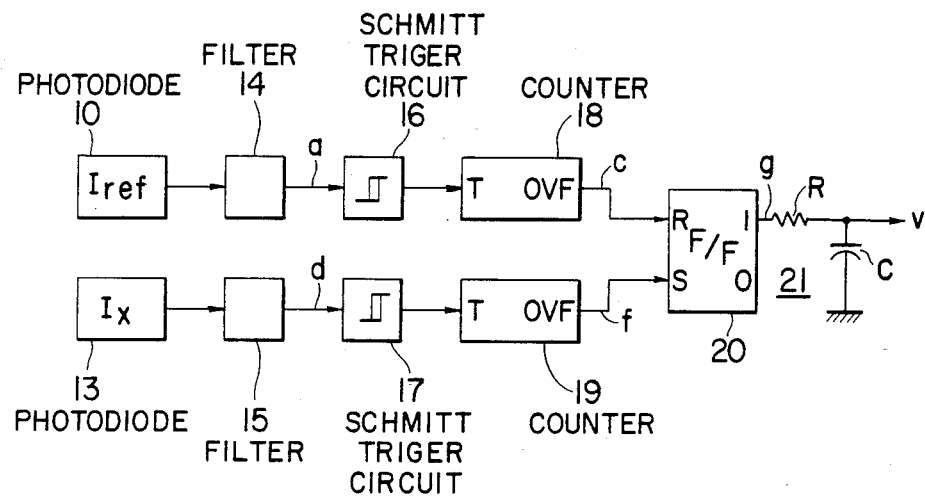
FIG. 3 is a block diagram showing an electric circuit constituting another portion of the measuring device of this invention.
Figure 4:
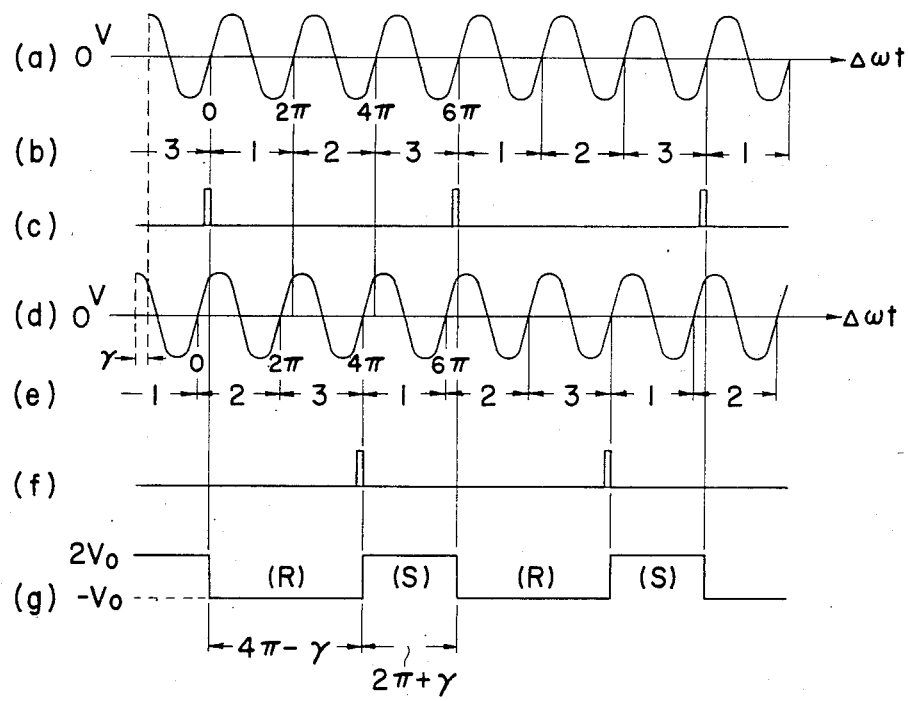
FIG. 4 is a graph showing waveforms and the timings of occurrence of electric signals in the circuit shown in FIG. 3.

In the circuit shown in FIG. 3, the $\Delta\omega$-frequency component of the electric signal $I_{ref}$ expressed by the equation (12) is extracted by a filter 14 so as to provide a sinusoidal wave having no DC component as indicated by a curve (a) in FIG. 4. The sinusoidal wave is passed through a Schmitt trigger circuit 16 so as to produce a rectangular waveform. A three-stage counter 18 is triggered at the rising edge of the Schmitt trigger output signal, and changes its state in the order of 1, 2, 3, 1, 2, 3 . . . so on, as shown in FIG. 4(b). Each time when the state is changed from 3 to 1 the counter 18 delivers an output pulse C for resetting a flip-flop circuit 20 as shown in FIG. 4(c).

On the other hand, the $\Delta\omega$-frequency component of the laser light phase-modulated by the birefringence phase difference $\gamma$ is extracted by a filter 15 out of the electric signal $I_x$ of equation (10) delivered from the photodiode 13. The extracted signal is a sinusoidal wave as shown in FIG. 4(d). The sinusoidal wave is converted by another Schmitt trigger circuit 17 into a rectangular waveform, and each time when the input sinusoidal wave of the Schmitt trigger circuit 17 exceeds the zero voltage level, another three-stage counter 19 is triggered. The counter 19 changes its state sequentially as shown in FIG. 4(e) in the order of 1, 2 and 3, and each time when the state is changed from 3 to 1, the counter 19 delivers an output pulse f as shown in FIG. 4(f), which is applied to the flip-flop circuit 20 for setting it.

As a consequence, the interval during which the flip-flop circuit 20 is reset is made to be equal to $4\pi - \gamma$ (rad), while the interval during which the flip-flop circuit 20 is set is made to be equal to $2\pi + \gamma$ (rad) as shown in FIG. 4(g).

The flip-flop circuit 20 delivers an output equal to $2V_0$ when it is set, and an output equal to $-V_0$ when it is reset. A low-pass filter 21 of a RC type which cuts off the frequency component signal is connected to receive the output for producing a filtered frequency signal V representing the average value of the output, $$V = \frac{2V_0(2\pi + \gamma) - V_0(4\pi - \gamma)}{6\pi} \qquad (13)$$

$$= \frac{V_0}{2\pi}\gamma$$

which is directly proportional to the birefringence phase difference $\gamma$. Since the optical superheterodyne demodulation method is utilized in the present invention, any deviation of the frequency difference $\Delta\omega$ causes no error in the output voltage V of the measuring device. Furthermore, since the DC components of the electric signals $I_{ref}$ and $I_x$ are cut-off by the filters 14 and 15, any drift in the characteristic of photodiodes 10 and 13 produces no effect on the accuracy of the measuring device. The zero voltage points which are exceeded by the up-going signal of the $\Delta\omega$ frequency components of the electric signals $I_{ref}$ and $I_x$ given by the equations (10) and (12) are detected by the Schmitt trigger circuits 16 and 17 regardless of the amplitudes $a^2/2$, and therefore any variation in the light intensity delivered from the laser device 7 or caused by optical loss in the optical path produces no error in the measured value.

Figure 2:
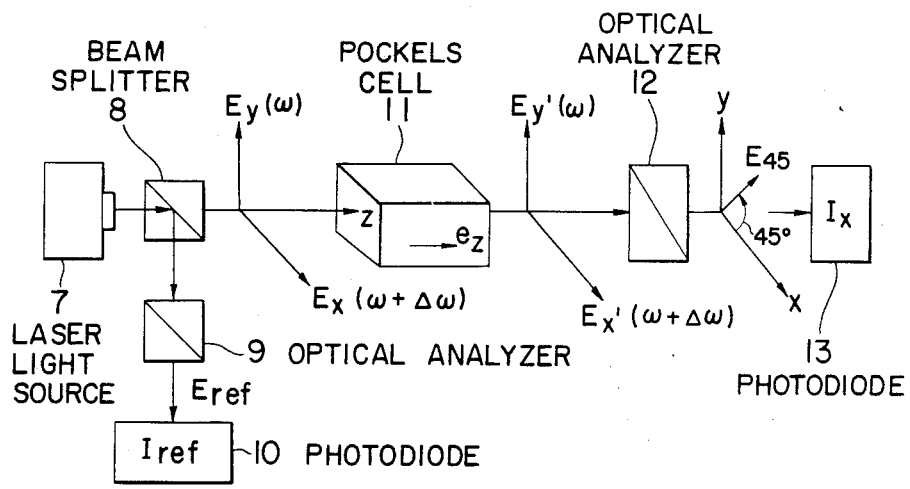
FIG. 2 is a diagrammatic representation showing an optical system constituting an important portion of a birefringence type measuring device according to the present invention.

The device shown in FIGS. 2 and 3 has a measuring range of $\pm 3\pi$ rad. for the birefringence phase difference $\gamma$, and the measuring range can be further expanded as desired by increasing the number of stages of the counters 18 and 19. In addition, it is apparent that this invention is applicable not only to the above described device utilizing the Pockels effect, but also to those devices which measure physical values utilizing the birefringence phase difference.

Figure 5:
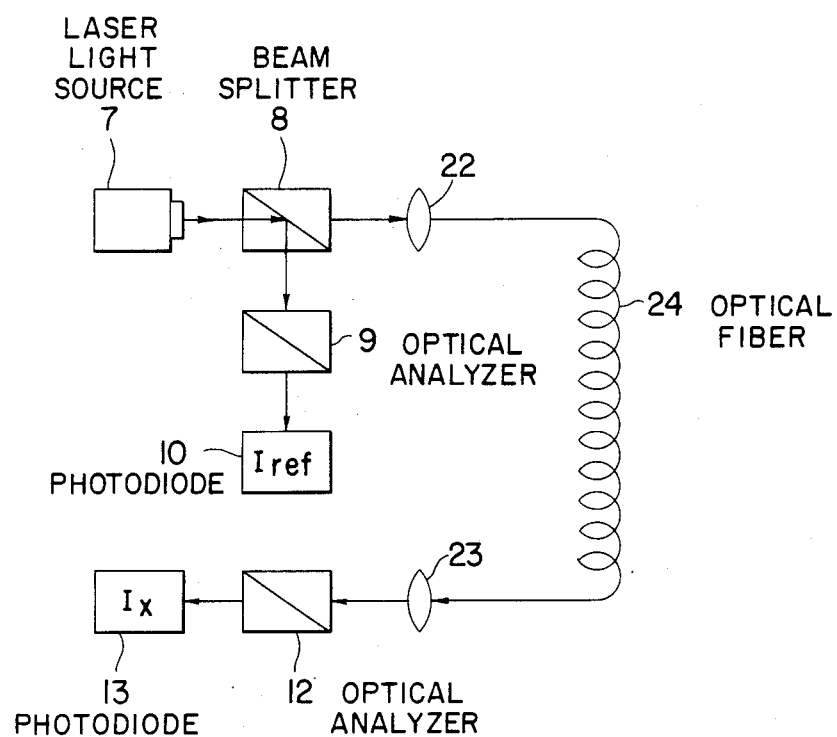
FIG. 5 is a block diagram showing the construction of another embodiment of the present invention.

Another embodiment of the present invention which is suitable to measure various physical values such as temperature, pressure, piezoelectric distortion, magnetic field, electric current and the like is illustrated in FIG. 5 wherein members similar to those shown in the first embodiment are designated by same reference numerals.

In this embodiment, a two-frequency laser light source 7 produces a linearly polarized laser light having an x-axis component and a y-axis component as in the case of the first embodiment shown in FIG. 2. The laser light is then divided by a beam splitter 8 into two portions, one being transmitted through a lens system 22 into an optical fiber 24. The laser light transmitting through the optical fiber 24 passes through another lens system 23 and an optical analyzer 12 to a photodiode 13 wherein the laser light is converted into an electric signal $I_x$. The other portion of the laser light divided by the beam splitter 8 is sent through another optical analyzer 9 to another photodiode 10 to be converted into a reference electric signal $I_{ref}$.

Various kinds of optical fibers such as a single-mode fiber, a multimode fiber, polarization plane holding fiber and the like may be used as the optical fiber 24. It is known that these fibers exhibit a birefringence effect when ambient temperature varies, or a pressure or a stress is applied thereto for producing strain in the optical fiber, or when a magnetostriction or an electrostriction substance is coated around the optical fiber and a magnetic field or an electric field is applied thereto. Accordingly, a birefringence phase difference $\gamma$ can be detected by the circuit shown in FIG. 5, and the various physical values can be determined from the birefringence phase difference $\gamma$.

According to the present invention, since the phase difference can be detected independently of the variation in the amplitude and intensity of the laser light, any variation in the loss of light caused by the optical fiber 24 results in no erroneous operation of the measuring device. For this reason, the length of the optical fiber 24 shown in FIG. 5 may be increased, so that the total sum of the physical value distributed along the length of the optical fiber may be accurately detected.

According to the present invention, since a phase modulation by the birefringence phase difference is utilized, optical loss does not affect the accuracy of the measurement, and therefore the length of the optical paths can be substantially elongated. Furthermore, no complicated calculation as in the conventional devices is required, so that a birefringence type measuring device having a high response speed and a high precision can be realized.

I claim:

1. A measuring device utilizing birefringence effect comprising:
   means for producing laser light having two components of a first frequency and a second frequency, which are polarized in directions perpendicular to each other;
   birefringence means comprising an electro-optical device provided to receive said laser light and to deliver an output laser light having first and second components, said components having a phase difference varied in accordance with an electric field to be measured;
   an optical analyzer provided to receive the optical output of said birefringence means and to extract a component polarized in a predetermined direction;
   a photoelectric converter for converting said extracted component of said light output into an electric signal having a frequency corresponding to a difference between said first and second frequencies and being phase modulated by said phase difference varied in accordance with the electric field to be measured;
   means for extracting one portion of said laser light delivered from said laser light producing means, and for converting said one portion of laser light into a reference electric signal; and
   processing means for comparing said phase-modulated electric signal delivered from said photoelectric converter with said reference electric signal so as to produce an output representing said phase difference corresponding to the electric field.

2. A measuring device as set forth in claim 1 wherein said processing means compares said phase modulated electric signal delivered from said converter with said reference electric signal.

3. A measuring device as set forth in claim 1 wherein said processing means comprises first and second counters for counting predetermined number of cycles of said phase modulated electric signal and said reference electric signal, respectively, each of said counters delivering an output signal upon counting said predetermined number of cycles, and a flip-flop circuit which is set by an output of said first counter and reset by an output of said second counter.

4. A measuring device as set forth in claim 3 wherein said first and second counters count a predetermined number of up-going cross of a zero-voltage level of said phase modulated electric signal and said reference electric signal, respectively.

5. A measuring device as set forth in claim 3 wherein an averaging circuit is connected to the output side of said flip-flop circuit.

6. A measuring device as set forth in claim 1 wherein said birefringence means comprising an electro-optical device comprises a Pockels cell.

7. A measuring device as set forth in claim 1 wherein said birefringence means comprising an electro-optical device comprises an optical fiber.

* * * * *